(12) United States Patent
Chia et al.

(10) Patent No.: US 9,042,850 B2
(45) Date of Patent: May 26, 2015

(54) INCREASING EFFICIENCY OF A RADIO RECEIVER WITH AN ADAPTIVE TUNER

(75) Inventors: Wei Ming Dan Chia, Singapore (SG); Brian Sunil Nicholas Fernandes, Singapore (SG); Yinn Sinn Tang, Johor Bahru (MY); Min Tak Lee, Johor Bahru (MY); Ye Yuan, Edmonton (CA); Syaiful Bakhri, Singapore (SG)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/238,562

(22) PCT Filed: Aug. 12, 2011

(86) PCT No.: PCT/IB2011/053591
§ 371 (c)(1),
(2), (4) Date: Mar. 14, 2014

(87) PCT Pub. No.: WO2013/024321
PCT Pub. Date: Feb. 21, 2013

(65) Prior Publication Data
US 2014/0194079 A1    Jul. 10, 2014

(51) Int. Cl.
H04B 1/18       (2006.01)
H03J 7/02       (2006.01)
H04H 20/62      (2008.01)
H04H 40/18      (2008.01)
H04H 60/51      (2008.01)
H04H 60/90      (2008.01)
H04H 60/70      (2008.01)

(52) U.S. Cl.
CPC *H03J 7/02* (2013.01); *H04H 20/62* (2013.01); *H04H 40/18* (2013.01); *H04H 60/51* (2013.01); *H04H 60/90* (2013.01); *H04H 60/70* (2013.01)

(58) Field of Classification Search
CPC .......... H04B 1/082; H04B 1/16; H04H 20/62
USPC ............ 455/77, 150.1, 178.1, 191.1, 280, 73, 455/130, 160.1, 173.1, 182.3, 184.1, 3.02
See application file for complete search history.

(56) References Cited

U.S. PATENT DOCUMENTS

| 6,647,245 B1 | 11/2003 | Rosenbaum |
| 7,457,598 B2 | 11/2008 | Zahm et al. |
| 2003/0040272 A1* | 2/2003 | Lelievre et al. ............. 455/3.06 |

(Continued)

FOREIGN PATENT DOCUMENTS

| DE | 20 2004 005 208 | 8/2004 |
| EP | 1 555 754 | 7/2005 |

(Continued)

*Primary Examiner* — Tuan Pham
(74) *Attorney, Agent, or Firm* — Cozen O'Connor (57) ABSTRACT

A mobile radio receiver for a vehicle includes a tuner front-end section, a location data port for receiving tuner location data, a sensor port for receiving sensor signal measurement data from at least one vehicle sensor, a tuner front-end section parameter server port for sending the tuner location data, the sensor signal measurement data for receiving a set of tuner front-end section parameter data, and a data processing unit. The data processing unit is operably connected to the tuner front-end section, the location data port, the sensor port, and the tuner front-end section parameter server port. The mobile radio receiver provides an operational mode, a checking mode, a tuner parameter retrieval mode, and a tuner parameter application mode.

15 Claims, 5 Drawing Sheets

(56) References Cited

U.S. PATENT DOCUMENTS

| | | |
|---|---|---|
| 2003/0236096 A1 | 12/2003 | Yamazaki |
| 2004/0203718 A1 | 10/2004 | Knauerhase et al. |
| 2005/0157885 A1 | 7/2005 | Olney et al. |
| 2005/0181755 A1 | 8/2005 | Hoshino et al. |
| 2005/0227656 A1 | 10/2005 | Zahm et al. |
| 2006/0271246 A1 | 11/2006 | Bell et al. |
| 2007/0135978 A1 | 6/2007 | Kim et al. |
| 2008/0081582 A1 | 4/2008 | Rofougaran |
| 2008/0119148 A1 | 5/2008 | Ray |
| 2011/0034139 A1 | 2/2011 | Xuan et al. |
| 2013/0288625 A1 | 10/2013 | Bakhri |
| 2014/0194079 A1 | 7/2014 | Bakhri et al. |

FOREIGN PATENT DOCUMENTS

| | | |
|---|---|---|
| EP | 1 564 909 | 8/2005 |
| EP | 1 924 002 | 5/2008 |
| KR | 2003-0028297 | 4/2003 |

\* cited by examiner

INCREASING EFFICIENCY OF A RADIO RECEIVER WITH AN ADAPTIVE TUNER

CROSS-REFERENCE TO RELATED APPLICATIONS

This is a U.S. national stage of PCT Application No. PCT/IB2011/053591, filed on 12 Aug. 2011, which is hereby incorporated in its entirety by reference.

PCT Application No. PCT/IB2010/054929 ('929 application) is also hereby incorporated in its entirety by reference. For the sake of brevity, the embodiment of the '929 application (together with its alternatives and implementations) described in page 14, line 4 to page 31, line 17 and illustrated in FIGS. 1-13 is herein referenced. The embodiment is related to a radio tuner unit intended for installing in an automobile and a method of using the radio tuner unit.

FIELD OF THE INVENTION

This application relates to a radio receiver. In particular, the application relates to a radio receiver with a tuner server for a vehicle.

DESCRIPTION OF THE RELATED ART

Automotive vehicles are commonly equipped with radios for receiving wireless broadcast radio frequency (RF) signals. These radios process the received RF signals and then broadcast audio sounds together with other information to passengers in the vehicles while the automotive vehicles travel amongst various locations.

The radio typically includes various electronics that comprises an RF tuner. The RF tuner selects a frequency bandwidth of input RF signals and outputs audio signals. The audio signals are typically amplified for broadcasting via audio speakers. The RF tuner may include a frequency modulated (FM) module for receiving FM modulated signals and amplitude modulated (AM) module for receiving AM signals.

Conventional vehicle radio receivers are typically programmed with preset tuning parameters that determine tuner settings. The tuning parameters typically include parameters that adjust gain of an automatic gain control (AGC), parameters that adjust intermediate frequency (IF) bandwidth, parameters that adjust audio channel separation, parameters that adjust audio high frequency roll-off, and parameters that adjust audio amplitude. The preset tuning parameters typically do not change and are selected initially in an attempt to accommodate a wide range of signal reception conditions.

SUMMARY OF THE INVENTION

It is an object of the application to provide an improved mobile radio receiver. It is believed that a remote computer server can receive tuner information and/or tuner parameter information relating to different conditions, such as location and time span, from the vehicle mobile radio receiver. The tuner information includes vehicle sensor information and other information. The computer server can share the received tuner parameter information with other vehicle mobile radio receivers. The received tuner parameter information from different vehicle mobile radio receivers can also be compared or be correlated to improve the tuner parameter generation.

A mobile radio receiver can be provided for a vehicle, such as a car, a ship, or an aircraft. The mobile radio receiver includes a tuner front-end section, a location data port, a sensor port, and a data processing unit. The term location refers to a geographical area or region and not to a specific geographical point. Put differently, the location can relate to geographical coordinates defining a region or an area, such as Europe, India, China, or North America.

The tuner front-end section is used for receiving radio signals from an antenna and for processing the received radio signals. The tuner front-end section provides a hardware that can be adjusted according to input front-end section parameters, such as gain or attenuation. The adjustment can be done by a programmable tuner front-end integrated circuit through settings of software parameters or by using a D/A (digital to analog) converter.

The location data port is used for receiving tuner location data. The sensor port is used for receiving one or more sensor signals. The sensor signals can originate from one or more internal or external measuring devices. The internal measuring devices generate internal measurement signals that are derived from radio signals received after an antenna plug. The internal measurement signals can include a front-end section signal or an audio signal that is produced after the front-end section, wherein the measurement signals can relate to Signal to Noise Ratio (SNR) parameter, Total Harmonic Distortion (THD) parameter, multipath parameter, or field strength parameter. In contrast, the external measuring devices are provided with external sensors for measuring external conditions, such as ambient weather parameter, examples of this are temperature and humidity. Another example the external conditions relate to signal strength that is measured by a microphone.

The data processing unit is connected operably with the tuner front-end section, with the location data port, and with the sensor port. The data processing unit includes a processor, such as a microprocessor or an audio signal Digital Signal Processor. The data processing unit also includes two or more predetermined tuner location data and two or more predetermined relationship data sets for determining a set of tuner front-end section parameters based on the sensor signals.

The tuner location data and the relationship data sets are often stored using a tuner parameter database. In a special case, the relationship data set comprises only one single tuner front-end section parameter. The predetermined relationship data set together with a predetermined data operation defines a relationship between the sensor signal and the tuner front-end section parameters.

The mobile radio receiver provides an operational mode, a checking mode, a tuner parameter adjustment mode, and a tuner parameter application mode. One or more of the modes may occur at the same time. For example, the operational mode and the checking mode can occur at the same time. From time to time or depending on the sensor signals, the mobile radio receiver enters the checking mode, while still operating in the operational mode. In particular, in the operational mode, the tuner front-end section operates according to one or more sets of tuner front-end section parameter.

In the checking mode, the data processing unit receives the sensor signals and it checks the sensor signals against one or more pre-determined thresholds. In many cases, the mobile radio receiver enters or changes to the parameter adjustment mode when one or more sensor signals exceed the said threshold whilst the mobile radio receiver enters the operational mode when the sensor signal data falls or drops below the said threshold.

In the parameter adjustment mode, the data processing unit determines a new set of tuner front-end section parameters based on the tuner location data, on the above-mentioned relationship data set and on the sensor signal. The present sets of the tuner front-end section parameter are often updated with the new set of tuner front-end section parameters. After this, the mobile radio receiver often enters the parameter application mode.

In the parameter application mode, the data processing unit updates the tuner front-end section with the new set of tuner front-end section parameters. The mobile radio receiver later often enters the operational mode.

The tuner location data can include actual geographic data, actual time data, or both actual geographic data and actual time data. The geographic data, the time data, or both can be used for retrieving or selecting the relationship data sets. This allows for an improved receiver, especially when location comprises actual time, because during nighttime the correlation between sensor values may be different from the correlation during daytime.

In a special case, the tuner location data includes data related to signal conditions of a location. Examples of the signal condition data are location data of radio transmitters and structures affecting radio signals, such as tall buildings and tunnels.

In a database type of implementation, the data processing unit includes two or more tuner parameter records. Each of the tuner parameter records comprises a pre-determined tuner location data and a pre-determined relationship data set. In the parameter adjustment mode, the data processing unit determines a new set of tuner front-end section parameters by retrieving a tuner parameter record using the tuner location data. The new tuner front-end section parameters are then generated with this tuner parameter record.

In this aspect of the application, the relationship between the sensor data and the tuner front-end section parameters is kept in at least two individual data sets. This provides an improved operation as compared with a receiver that provides only one single relationship between the sensor data and the tuner front-end section parameters, which are often adjusted at the time of producing the radio receiver. While the performance of a radio receiver with a set relationship between the sensor data and the tuner front-end section parameters can only be improved marginally by controlling parameters, such as RF gain or IF gain, the application provides a set of radios with very different characteristics. For instance, according to one data set for determining the tuner front-end section parameters, the attenuator and the RF selectivity would be fully set in order to cope with two strong and interfering transmitters that are in the close vicinity of the radio receiver. According to another data set for determining the tuner front-end section parameters, the attenuator would be set to zero and the RF selectivity would be set to "broad", while the IF selectivity is set to "narrow" in order to listen to a weak signal from a single distant transmitter.

The data processing unit can include a pre-determined set of correlations among two or more sensor signals. This set of correlation is then used to determine a new set of tuner front-end section parameters. Specifically, in the parameter adjustment mode, the data processing unit determines a new set of tuner front-end section parameters based on the tuner location data, on a relationship data set, on the sensor signal, and on the set of correlations. Often, the data processing unit includes two or more correlation records. Each correlation record includes a predetermined tuner location data and a pre-determined set of correlations.

In the parameter adjustment mode, the data processing unit determines a new set of tuner front-end section parameters by retrieving the correlation record using the tuner location data. The new tuner front-end section parameters are then generated with the set of correlation of this correlation record.

To cater for situations in which the mobile radio receiver travels to a new location, the checking mode often includes a step of the data processing unit checking the tuner location data against pre-determined location data. The mobile radio receiver enters the parameter adjustment mode when the tuner location data is different from the pre-determined location data. This allows the mobile radio receiver to adjust its parameters when the mobile radio receiver enters a new location.

In practise, the tuner front-end parameters often comprise a signal sensitivity parameter. The signal sensitivity is intended for adjusting a gain, attenuation, or multipath parameter of the tuner front-end section.

The mobile radio receiver can include an input device, such as a touch screen or a button, for receiving an input from a user. The input can be used to receive permission for the user to accept or to use the new tuner front-end parameter(s).

The data processing unit can include user preference data. These data has user preference information and can be used for determining acceptance of the new tuner front-end section parameter.

A method of operating a mobile radio receiver can be provided for a vehicle. The method includes an operation, a check, a parameter adjustment, and a parameter application. The operation comprises operating a front-end section of the mobile radio receiver according to at least one predetermined tuner front-end section parameter. The mobile radio receiver then often performs the check.

The check includes an act of receiving one or more sensor signals from a sensor port. The sensor signals are then checked against one or more pre-determined corresponding thresholds by a data processing unit. The mobile radio receiver then performs the parameter adjustment when one of the sensor signals exceeds its corresponding threshold. Similarly, the mobile radio receiver performs the operation when the sensor signals fall or drop below their corresponding thresholds.

The parameter adjustment includes an act of determining or generating a new set of tuner front-end section parameters based on the tuner location data, a relationship data set, and the sensor signals by the data processing unit. The relationship data set is used for determining a set of tuner front-end section parameters based on the at least one sensor signal. The mobile radio receiver often then performs the parameter application.

The parameter application comprises an act of updating the tuner front-end section with the new set of tuner front-end section parameters together with its corresponding tuner location data by the data processing unit. The mobile radio receiver often later performs the operation.

The operation can comprise an act or step of recording sensor signal data into a memory unit of the data processing unit. The sensor signal data can be recorded together with its corresponding time stamp data. This provides a time parameter for adjusting a tuner parameter. The recorded sensor signal data can be averaged to reduce effects of glitches or one-time events.

The check can include an act of checking the tuner location data against pre-determined location data by the data processing unit. The mobile radio receiver then enters the parameter adjustment act when the tuner location data is significantly different from the pre-determined location data. The term significant is in reference to a notable audio influence that is decided by a user of the mobile radio receiver.

The parameter adjustment can comprise an act of requesting permission from a user to apply or use the new tuner front-end parameter(s). The parameter adjustment can comprise checking whether the new tuner front-end parameter(s) are different significantly from the predetermined tuner front-end parameter(s). The mobile radio receiver then enters the operation when the checking determines that the new tuner front-end parameter(s) are essentially the same as the predetermined tuner front-end parameter(s).

In short, this application provides a method to improve tuner unit performance. The method includes a step of a tuner unit recognizing characteristics of a tuner unit for an automobile system. The tuner unit then adjusts intelligently its tuner unit characteristics to improve tuner unit performance. The adjustments are intelligent in that the tuner unit characteristics are adapted dynamically according to actual tuner unit performance.

The method also uses locations of the automobile systems, which are already provided by components blocks of the automobile system. The method is able to improve tuner unit performance using one single tuner without additional investment in existing automotive infrastructure.

This application provides a device to improve tuner unit performance. The device includes parts that are similar to parts of many existing implementations of automobiles. The device also includes pre-calibrated data that serves as initial settings of the tuner unit and an algorithm for intelligent processing of received signals. The processing is intelligent in that parameters of the tuner unit adapt dynamically according to actual tuner unit performance.

In addition, the tuner unit parameters are then stored according to regions, which are pre-defined or are predetermined in a module of the device. As automobile carrying the device travels to a particular region, the device would use the stored tuner unit parameters of the particular region. The tuner unit may request a confirmation of the new tuner parameters from the user before storing and using the new tuner parameters.

These above steps are done repeatedly to improve further the tuner unit performance. Therefore, the regions used more frequently by the end-user would have better tuner unit performance.

The improved tuner unit performance has an advantage of improving driver experience and improving ease of getting audio and information from tuner stations due to better tuner unit performance.

This is different from most current implementations of radio and navigation systems in which their tuners are adjusted with the use of field-testing. This field-testing uses one fixed test route to cover requirements of customers who may reside in different regions and in different countries.

The test route is used to provide a majority of scenarios or environmental and signal conditions, which includes a perceived worst-case scenario that the tuner would be subjected to. In other words, the field-testing adjusts or improves a tuner performance based on one fixed test route. However, in use, the test route is not able to cover all environmental and signal conditions that these tuners would face due to many variations in operating environmental conditions and due to many variations in weak or strong interfering points from signal transmitters of radio broadcasting stations.

The application provides a mobile radio receiver for a vehicle. This mobile radio receiver avoids generation of tuner parameters, which consumes computing resources. Instead, this mobile receiver obtains required tuner parameters from a computer server. The mobile radio receiver comprises a tuner front-end section, a location data port, a sensor port, a tuner front-end section parameter server port, and a data processing unit.

In use, the tuner front-end section often includes a Digital Signal processor (DSP) for receiving tuner front-end section parameters and for operating according to these received tuner front-end section parameters. The operational tuner front-end section also receives radio signals as well as changing and treating these radio signals such that these treated radio signals allow other parts of the mobile radio receiver to provide improved audio sounds.

The location data port is intended for receiving tuner location data. In contrast, the sensor port is used for receiving at least one sensor signal measurement data of the mobile radio receiver. As an example, the sensor signal measurement data can include weather data or radio receiver performance data, such as signal to noise data.

The tuner front-end section parameter server port is used for sending the tuner location data with the at least one corresponding sensor signal measurement data to a tuner front-end section parameter server to request for a corresponding set of tuner front-end section parameter data. The said server port is also used for receiving a set of tuner front-end section parameter data from the tuner front-end section parameter server.

The data processing unit is operably connected with the tuner front-end section, with the location data port, with the sensor port, and with the tuner front-end section parameter server port.

Functionally, the mobile radio receiver provides an operational mode, a checking mode, a tuner parameter retrieval mode, and a tuner parameter application mode. In the operational mode, the tuner front-end section operates according to one set of tuner front-end section parameter.

In the checking mode, the data processing unit checks one or more sensor signal measurement data against one or more pre-determined threshold data such that the mobile radio receiver enters the parameter retrieval mode when at least one sensor signal measurement data exceeds the corresponding pre-determined threshold data.

In the parameter retrieval mode, the tuner front-end section parameter server port sends the tuner location data with the corresponding sensor signal measurement data to the tuner front-end section parameter server for requesting a set of tuner front-end section parameter data. The server port also later receives the requested new set of requested tuner front-end section parameter data from the tuner front-end section parameter server.

In the parameter application mode, the data processing unit updates the tuner front-end section with the received new set of tuner front-end section parameter data.

The data processing unit often includes a local storage device for storing the set of tuner front-end section parameters, corresponding tuner location data, and at least a part of corresponding sensor signal measurement data. The mobile radio receiver can then provide a parameter storage mode. In this parameter storage mode, the local storage device stores the set of tuner front-end section parameters, the corresponding tuner location data, and the at least a part of corresponding sensor signal measurement data. Over time, the local storage device can accommodate a large number of tuner front-end section parameters from which the mobile radio receiver can retrieve the required parameters, when needed.

The local storage device can store at least two predetermined relationship data set for determining a set of tuner front-end section parameters corresponding to at least a part of sensor signal measurement data. This enables the mobile radio receiver to provide a tuner parameter adjustment mode. In the parameter adjustment mode, the data processing unit determines a new set of tuner front-end section parameters according to the relationship data set, the tuner location data, and the at least a part of sensor signal measurement data.

The parameter adjustment mode provides another way of obtaining tuner front-end section parameters. In practise, there may be periods when the tuner front-end section parameter server does not respond to parameter request(s) from the mobile radio receiver. During these periods, the mobile radio receiver can operate in the parameter adjustment mode to obtain the necessary tuner front-end section parameters.

The mobile radio receiver can also provide a tuner front-end section parameter server update mode. After operating in the parameter adjustment mode, the mobile radio receiver can operate in the parameter server update mode, wherein the tuner front-end section parameter server port sends the new set of tuner front-end section parameters, corresponding tuner location data, and at least a part of corresponding sensor signal measurement data to the tuner front-end section parameter server via the tuner front-end section parameter server port. In essence, this allows the mobile radio receiver to share its tuner front-end section parameters and its associated data with the tuner front-end section parameter server and with other mobile radio receivers.

The data processing unit often verifies data being transferred with the parameter server to ensure that the data has a correct format. This is to prevent erroneous data from being transmitted.

The application provides a tuner front-end parameter section parameter server for a mobile radio receiver of a vehicle. The parameter server provides a required set of tuner front-end section parameters to the mobile radio receiver.

The tuner front-end parameter section parameter server has a mobile radio receiver port, a server storage device, and a data processing unit. The mobile radio receiver port is used for sending a set of tuner front-end section parameters to the mobile radio receiver. The mobile radio receiver port also serves to receive tuner location data and at least one corresponding sensor signal measurement data from the mobile radio receiver.

The server storage device stores at least two tuner location data, at least two corresponding sensor signal measurement data, and at least two corresponding sets of tuner front-end section parameters. In contrast, the data processing unit is operably connected with the mobile radio receiver port and with the server storage device.

In use, the tuner front-end section parameter server provides a tuner parameter provision mode. In the tuner parameter provision mode, the mobile radio receiver port receives the tuner location data and the at least a part of corresponding sensor signal measurement data from the mobile radio receiver. The data processing unit then retrieves one set of tuner front-end section parameters according to the received tuner location data and the received at least a part of corresponding sensor signal measurement data. The mobile radio receiver port later sends the retrieved set of tuner front-end section parameters to the mobile radio receiver. In this manner, the parameter server provides the tuner front-end section parameters to the mobile radio receiver.

The server storage device can also store at least two predetermined relationship data sets. This allows the tuner front-end section parameter server to provide a tuner parameter adjustment mode. The said server usually operates in the adjustment mode to produce or to generate tuner front-end section parameters that are requested by the mobile radio receiver when the server storage does not have or does not store the requested tuner front-end section parameters. In this parameter adjustment mode, the mobile radio receiver port receives the tuner location data and the at least a part of corresponding sensor signal measurement data from the mobile radio receiver. The data processing unit then determines a new set of tuner front-end section parameters according to the tuner location data, the corresponding sensor signal measurement data, and the relationship data set.

The tuner front-end section parameter server can also provide a parameter receipt mode. The parameter receipt mode allows the parameter server to receive new tuner front-end section parameters. In the parameter receipt mode, the mobile radio receiver port receives a new set of tuner front-end section parameters, corresponding tuner location data, and at least a part of corresponding sensor signal measurement data.

In addition, the tuner front-end section parameter server can provide a parameter storage mode. The parameter storage mode allows the parameter server to store the received tuner front-end section parameters. In the parameter storage mode, the server storage device stores the new set of tuner front-end section parameters, the corresponding tuner location data, and the at least a part of corresponding sensor signal measurement data in the server storage device.

The application provides a method for operating a mobile radio receiver of a vehicle. The method comprises an operation service, a check service, a parameter retrieval service, and a parameter application service. In particular, the operation service comprises a step of operating a tuner front-end section according to at least one predetermined tuner front-end section parameter.

The check service comprises an act of checking at least one sensor signal measurement datum against at least one threshold such that the mobile radio receiver performs the parameter retrieval when the at least one sensor signal measurement datum exceeds the at least one threshold.

The parameter retrieval service comprises a step of sending tuner location data and the at least one corresponding sensor signal measurement datum to a tuner front-end section parameter server and a step of receiving a new set of tuner front-end section parameter from the tuner front-end section parameter server. The parameter application service comprises a step of updating the tuner front-end section with the new set of tuner front-end section parameter.

Moreover, the method can comprise a parameter adjustment service. This service comprises an act of determining a new set of tuner front-end section parameters according to the tuner location data, the at least one corresponding sensor signal measurement datum, and a relationship data set.

After this, the parameter adjustment service can perform an act of sending the new set of tuner front-end section parameters, the corresponding tuner location data, and the at least one corresponding sensor signal measurement datum to the tuner front-end section parameter server.

The parameter application can comprise a step of storing the new set of tuner front-end section parameter, the corresponding tuner location data, and the at least one corresponding sensor signal measurement datum.

The application also provides a method for operating a tuner front-end section parameter server to provide an appropriate set of tuner front-end section parameters for a mobile radio receiver of a vehicle.

The method comprises a parameter provision that comprises a step of receiving a tuner location data and at least one corresponding sensor signal measurement datum from the mobile radio receiver. One specific set of tuner front-end section parameters out of a set of predetermined tuner front-end section parameters is then retrieved according to the received tuner location data and the received at least one corresponding sensor signal measurement datum. After this, the retrieved set of tuner front-end section parameters is sent to the mobile radio receiver.

In addition, when tuner front-end section parameters need to be generated, the method can further comprises a step of parameter adjustment, wherein this step includes determining a new set of tuner front-end section parameters according to the tuner location data, the at least one corresponding sensor signal, and a relationship data set. The new set of tuner front-end section parameters, together with the corresponding tuner location data and the corresponding at least one sensor signal, is then stored in a storage device.

The method can also include a parameter receipt service that comprises an act of receiving a new set of tuner front-end section parameters, corresponding tuner location data, and at least one corresponding sensor signal from the mobile radio receiver. The new set of tuner front-end section parameters, the corresponding tuner location data, and the at least one corresponding sensor signal are later stored in the storage device. This service allows the tuner front-end section parameter server to receive tuner front-end section parameters with corresponding data from the mobile radio receiver.

BRIEF DESCRIPTION OF THE DRAWINGS

The invention is explained in more detail below with reference to the figures. In the figures.

DETAILED DESCRIPTION OF THE PREFERRED EMBODIMENTS

In the following description, details are provided to describe embodiments of the application. It shall be apparent to one skilled in the art, however, that the embodiments may be practiced without such details.

Some parts of the embodiments have similar parts. The similar parts may have the same names or the similar part numbers. The description of one similar part also applies by reference to another similar parts, where appropriate, thereby reducing repetition of text without limiting the disclosure.

For sake of brevity, the embodiment of application PCT/IB2010/054929 with its alternatives and implementations are included here as a reference. The embodiment relates to a radio tuner unit and to a method of using the radio tuner unit. In particular, the method includes an act of the radio tuner unit collecting information, which may be related to physical location, information received from automobile onboard sensors, and weather information. The radio tuner unit then derives tuner parameters according to the collected information. The radio tuner unit later operates according to the derived tuner parameters, which allow the radio tuner unit to provide an optimized or an improved tuner performance for a particular operating condition.

Figure 1:
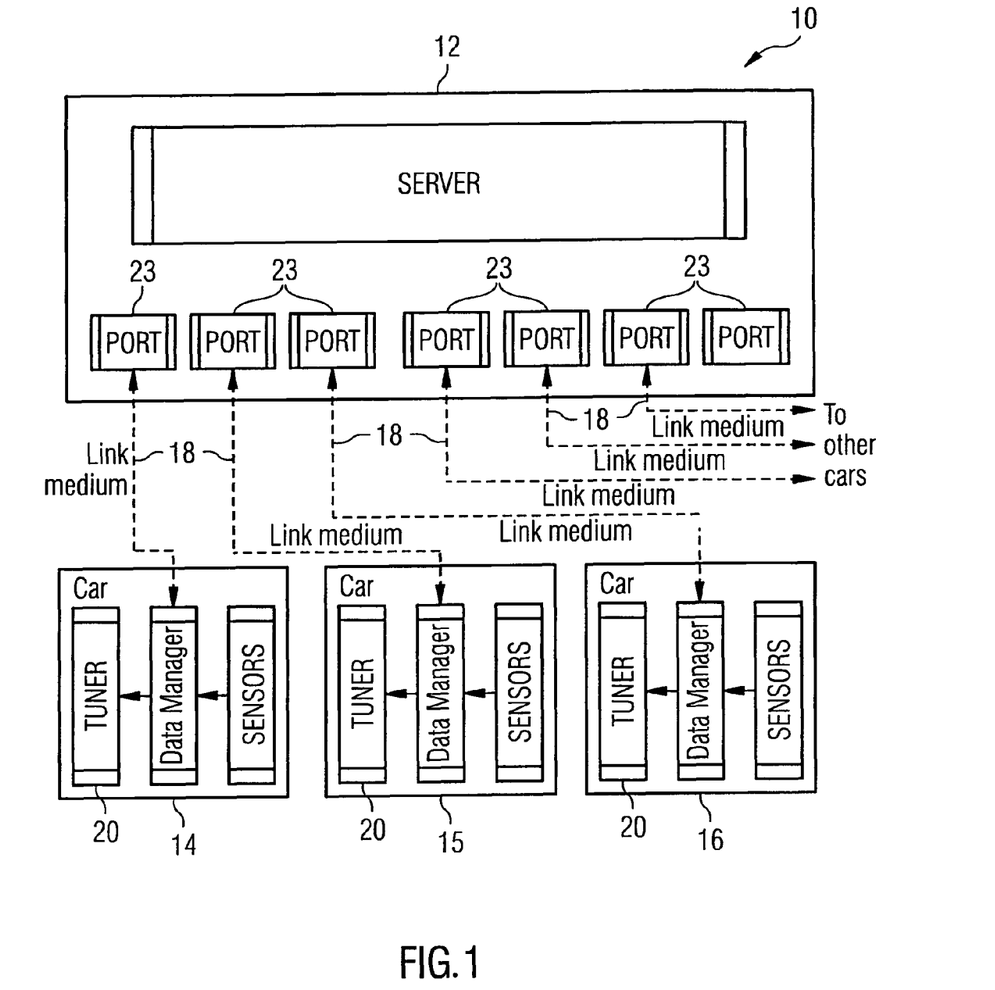
FIG. 1 illustrates a block diagram view of an improved radio tuner system in accordance with one embodiment of the invention.

FIG. 1 shows a block diagram of an improved radio tuner system 10. The radio tuner system 10 includes a server 12 being communicatively connected to several cars 14, 15, and 16 via several wireless link mediums 18. The link mediums 18 may include a third party communication backbone or a dedicated communication infrastructure.

Figure 2:
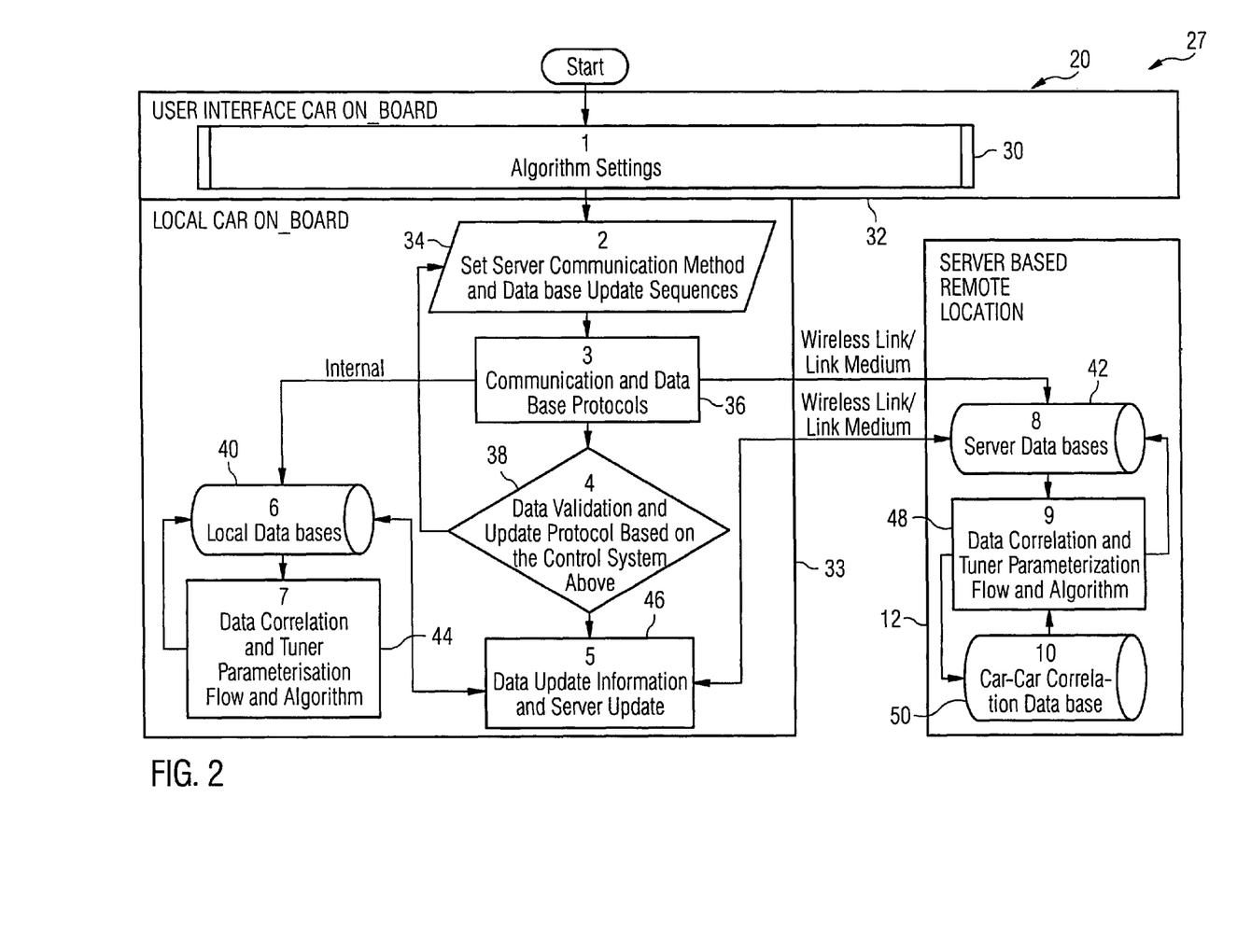
FIG. 2 illustrates a flow chart of generating tuner parameters for the radio tuner system of FIG. 1 in accordance with one embodiment of the invention.

The cars 14, 15, and 16 are located in one region and they are each installed with a radio tuner 20. As seen in FIG. 2, the radio tuner 20 includes a user interface board 32 and a tuner parameter processing board 33, wherein the user interface board 32 is connected electrically to the tuner parameter processing board 33. In contrast, the server 12 is located remotely from the cars 14, 15, and 16 and it has several physical communication ports 23.

In a general sense, the cars 14, 15, and 16 can be connected to one or more servers, wherein the servers can be located in one or multiple locations. The cars 14, 15, and 16 can also be located in one or more regions.

The server 12 can be a part of a centralized server or a part of a telecommunication service station. The physical ports 23 can be replaced by virtual ports, which refer to software emulation of the physical ports 23.

In use, the cars 14, 15, and 16 are intended for carrying drivers and passengers from one place to another. The drivers and the passengers are referred to here as users while the cars 14, 15, and 16 are also referred to as automobiles.

Referring to the radio tuners 20 of the cars 14, 15, and 16, they are used for exchanging information with the server 12 and for working with the server 12. Because of this, the radio tuners 20 are also referred to as car clients.

The user interface boards 32 of the radio tuners 20 are used for receiving user inputs. In contrast, the tuner parameter processing boards 33 of the radio tuners 20 are used for receiving tuner information that includes location information, car sensor information, weather information, user input information, as well as other information. If needed, the tuner parameter processing boards 33 generate tuner parameters for the respective radio tuners 20 according to the received tuner information. Steps of the tuner parameter generation are shown in the application PCT/IB2010/054929. The tuner-generated tuner parameters are applicable for a particular region or location, for a particular weather condition, and/or for a particular radio broadcasting station.

The tuner parameter processing boards 33 are also intended for storing the tuner information and the tuner-generated tuner parameters in a local radio tuner database. The tuner parameter processing boards 33 also sends the tuner information and the tuner-generated tuner parameters to the server 12 via the communication ports 23 and via the link mediums 18.

Referring to the server 12, it is also used for receiving the tuner information and the tuner-generated tuner parameters from the radio tuners 20. If needed, the server 12 generates tuner parameters according to the received tuner information. Steps of the tuner parameter generation are shown in the application PCT/IB2010/054929. Similar to the tuner-generated tuner parameters, the server-generated tuner parameters are applicable for a particular region or location, for a particular weather condition, and/or for a particular radio broadcasting station.

In addition, the server 12 is used for storing the tuner information, the tuner-generated tuner parameters, as well as the server-generated tuner parameters in a server radio tuner database. The server 12 is also intended for sending and sharing the appropriately stored tuner parameters with the radio tuner 20. The server 12 or the radio tuner 20 may generate the tuner parameters.

As compared with the radio tuners 20, the server 12 has a larger computing resource for tuner parameter generation, which allows for a faster tuner parameter generation. The server 12 also has a larger storage resource for holding information and the generated tuner parameters.

FIG. 2 shows a possible flow chart 27 of generating tuner parameters for radio tuner system 10 of FIG. 1. The flow chart 27 comprises a method selection service, a tuner-generated tuner parameters service, and a server-generated tuner parameter service. The method selection service is described below.

The flow chart 27 includes a step 30 of the user interface board 32 of the radio tuner 20 performing a setting or selection algorithm. The selection algorithm prompts the user to select a method for transferring information from the server 12 to the radio tuner 20 and to select a method of transferring information from radio tuner 20 to the server 12. The user is also prompted to select a database update sequence.

After this, a tuner parameter processing board 33 of the radio tuner 20 performs a step 34 of implementing the user-selected method for transferring information from the radio tuner 20 to the server 12 and the user-selected database update sequence for the local radio tuner database.

The step 34 also includes the tuner parameter processing board 33 sending to the server 12 information regarding the selected method for transferring information from the server 12 to the radio tuner 20 and the selected server database update sequence, which are selected by the user.

The server 12 then communicates with the tuner parameter processing board 33 according to the user-selected method and updates the server radio tuner database according to the user-selected database update sequence.

In a general sense, the server 12 and the radio tuner 20 can have default information transfer methods, which are pre-determined respectively by equipment suppliers of the server 12 and the radio tuner 20.

The tuner parameter processing board 33 also performs a step 38 of verifying that the information being exchanged between the server 12 and the radio tuner 20 has a correct format. In addition, the tuner parameter processing board 33 also checks for any request to change the method of communication or to change the database update sequence.

If any such incorrect information format or request is detected, the step 34 of selecting a communication method for communication and of selecting a database-update sequence is then performed again.

The tuner-generated tuner parameters service is described below.

After establishing a communication link between the server 12 and the tuner parameter processing board 33 as well as after establishing database update sequence for the local radio tuner database, the tuner parameter processing board 33 performs a step 40 of collecting tuner information from the radio tuner 20. The tuner parameter processing board 33 then stores the collected tuner information in the local radio tuner database. The collected tuner information may include location data, weather data, geographical data such as terrain information, and tuner performance data such as signal to noise ratio.

If needed, the tuner parameter processing board 33 performs a step 44 of generating new tuner parameters according to the collected tuner information. The generated tuner parameters are stored in the local radio tuner database and are used by the tuner 20 for improving or optimizing sound performance of the tuner 20.

The tuner parameter processing board 33 later performs a step 46 of updating or transferring the tuner information to the server 12. If new tuner parameters are generated, this generated information is also transferred to the server 12.

The server-generated tuner parameters service is described below.

The server 12 then performs a step 42 of receiving the tuner information from the tuner parameter processing board 33. If the server 12 has additional or new information, the server 12 may replace all or parts of the received information or include the additional information to the tuner information. In most implementation, the server 12 usually replaces environmental information of the tuner information with new environmental information.

The tuner parameter processing board 33 may just send the tuner information or just send the tuner information together with the corresponding tuner parameters. If the tuner parameter processing board 33 sends the tuner information together with the corresponding tuner parameters, the tuner parameter processing board 33 then stores this information in the server radio tuner database.

In practice, the server 12 receives and stores tuner information together with the corresponding tuner parameters from, not merely one tuner, but from a group of tuners.

If the server 12 receives only the tuner information, the server 12 can retrieve tuner parameters corresponding to the tuner information from the server radio tuner database and send this information to the radio tuner 20.

In other words, the server 12 acts as a central database for storing a plurality of tuner parameters with corresponding tuner information, which are related to different locations, weather conditions, or radio broadcasting stations. This server 12 enables a group of tuners to share their tuner parameter with each other. When a tuner is a new weather condition or in a new geographical location, the tuner does not need to spend its resource to generate new tuner parameters to improve its tuner performance. The geographical location here does not refer to a point but to an area or region. The tuner can retrieve the needed tuner parameters that are appropriate and relevant to its situation or conditions from the server 12.

If the server 12 does have the required corresponding tuner parameters, the server 12 can perform a step 48 of generating new tuner parameters according to the tuner information. The said step 48 of tuner parameter generation, which is performed by the server 12, is similar to the earlier described step 44 of tuner parameter, which is performed by the radio tuner 20. However, the server 12 usually has larger computing resource as compared to the tuner parameter processing board 33 and may thus be able to generate the new tuner parameters in a faster and more efficient manner.

The server 12 afterwards sends the stored tuner parameters to the radio tuner 20. A step 50 of correlating tuner parameters from the different radio tuners 20 is done after the step 48.

There are different methods for sending information from the server 12 to the car tuner or car client 20.

These methods comprise a time-based method, an interrupt-based method, and a push notification method. These methods can be used for transferring heavy or light load of information from the server 12 to the car client 20. In other words, these methods can be used for transmitting large or small amount of information from the server 12 to the car client 20.

In the time-based method, information is updated or is transferred periodically from the server 12 to the car client 20 at a fixed time interval. The fixed time interval is determined by the server 12 or by the car client 20 according to location of the car client 20, according to communication speed between the server 12 and the car client 20, and according to speed of the car client 20.

The interrupt-based method includes an act of the server 12 interrupting the car client 20, wherein the car client 20 stops performing its current task and changes its operating mode to receive information from the server 12. The server 12 then transfers information to the car client 20. This method preserves server resources since the server 12 generates the interrupt when the server 12 is in a ready state for information transfer. The server resources relate to bandwidth or capability of server processor for performing computing tasks and to bandwidth of server hard disk for storing and for transferring information.

Referring to the push notification method, when the car client 20 requires new information, the car client 20 sends a request, which is in a form of a push notification message, to the server 12. Later, when the server 12 is ready, the server 12 updates or transfers the requested information to the car client 20. The method allows the car client 20 to manage its resources such that the resources are able to perform its tasks but it does not provide a real-time interface or an immediate response between the server 12 and the car client 20.

Several methods for selecting the above methods to transfer information from the server 12 to the car client 20 are also possible. The methods include an automated selection method, a prompted selection method, a local selection method, and a server selection method.

In the automated selection method, the car client 20 selects automatically the method for transferring information from the server 12 to the car client 20 according to server resource loading, client resource loading, or wireless transmission link throughput between the server 12 and the car client 20. The resource loading refers to tasks performed by server computing processor or task performed by client computing processor. The resource loading also refers to tasks performed by server hard disk or tasks performed by client hard disk. The car client 20 uses the selected method in conjunction with predetermined settings and predetermined decisions for the method, which the car client 20 stores.

The prompted selection method includes a step of the client car 20 prompting a user to select the method for transferring information from the server 12 to the car client 20. A predetermined amount of waiting time is then provided for the user to select the method. If the user does not provide any method selection within the pre-determined waiting time, the car client 20 stops prompting the user and the car client 20 changes its operating mode to act according to the above automated selection method. This prompted selection method allows the user to select the information transfer method for each piece of information.

The local selection method allows selection of method of transferring information from the server 12 to the car client 20 according to pre-determined user inputs or pre-determined hardware settings. This method usually provides a faster information transfer between the car client 20 and the server 12. It is different from the automatic method, wherein the method of transfer is selected automatically based on current system conditions.

The server selection method allows the server 12, rather than the car client 20, to select the method for transferring information between the server 12 and the car client 20. The server 12 then selects the information transfer method according to number of car clients 20 in a region, to present weather conditions of the region, as well as to need of the car client 20 for information update.

Several methods of transferring information from the car client 20 to the server 12 are also possible. These methods include a continuous update method, an only relevant information method, an interrupt-based update method, a polling method, and a pull notification method.

The continuous update method includes a key information service and all-information all-the-time service. The key information service allows the car client 20 to transmit information to the server 12, wherein the information is arranged in order of importance or significant. Information of higher significance is transmitted before information of lower significance. The server 12 receives the information and arranges the received information according to a functional or working format. This service allows critical or more important information to be transmitted before other information. The transmission of other information may be interrupted to allow transmission of the critical information. In contrast, the all-information all-the-time service allows information to be transmitted from the car client 20 to the server 12 in accordance with a pre-determined sequence.

Referring to the only relevant information method, the method includes a step of the server 12 and the car client 20 sharing or exchanging requested information. The car tuner client 20 transmits to the server 20 only the information that is requested by the server 12. A certain communication overhead or resource is required for the information request. In general, this method allows transmitted information to be reduced.

The interrupt-based update method allows the server 12 to interrupt the car client 20 to request for information, which the server 12 wants or requires. The interrupt causes the car client 20 to stop performing its current task and to transfer the requested information. This method is similar to above described interrupt-based method for transferring information from the server 12 to the car client 20.

The polling method includes a step of the server 12 checking whether the car client 20 is available to transmit information. If the car client 20 is available to transmit information, the car client 20 acknowledges its availability and proceeds to transmit information to the server 12. Otherwise, the server 12 then checks with the car client 20 again later. This method allows the car client 20 to complete its present task before responding to the server request.

In the push notification method, the car client 20 issues a push notification message to the server 12 when the car client 20 has certain information for transmitting to the server 12. After receiving the push notification message, the server 12 then retrieves the said information from the car client 20.

The information transferred between the car client 20 and the server 12 can have different types of expiration. The kinds of expiration information include a time-based expiration, a region-based expiration, and a user-based expiration. The type of expiration information assigned to a piece of information is selected according to the type of the information. One piece of information can be assigned with one or more types of expiration information.

The time-based expiration provides an information with an expiration time-point, wherein the expiration time-point is derived according to an initial time point, which relates to when the information is generated or is received, and according to a pre-determined fixed expiration period. Information received from the car tuner 20 at an initial time point often need to be updated after the pre-determined fixed expiration period since current location and signal reception conditions of the car client 20 may have changed after the initial time point.

The region-based expiration provides an expiration timepoint, which is generated when the car client 20 has moved away from its initial location by a pre-determined distance. In other words, the information of the car client 20 is valid when the car client 20 remains only within a certain pre-defined region or area.

The user-based expiration provides an expiration time point, which is defined by a user according to time and space or location of the car client 20. This allows use of the information to be restricted within a certain period and space according to its application.

Figure 3:
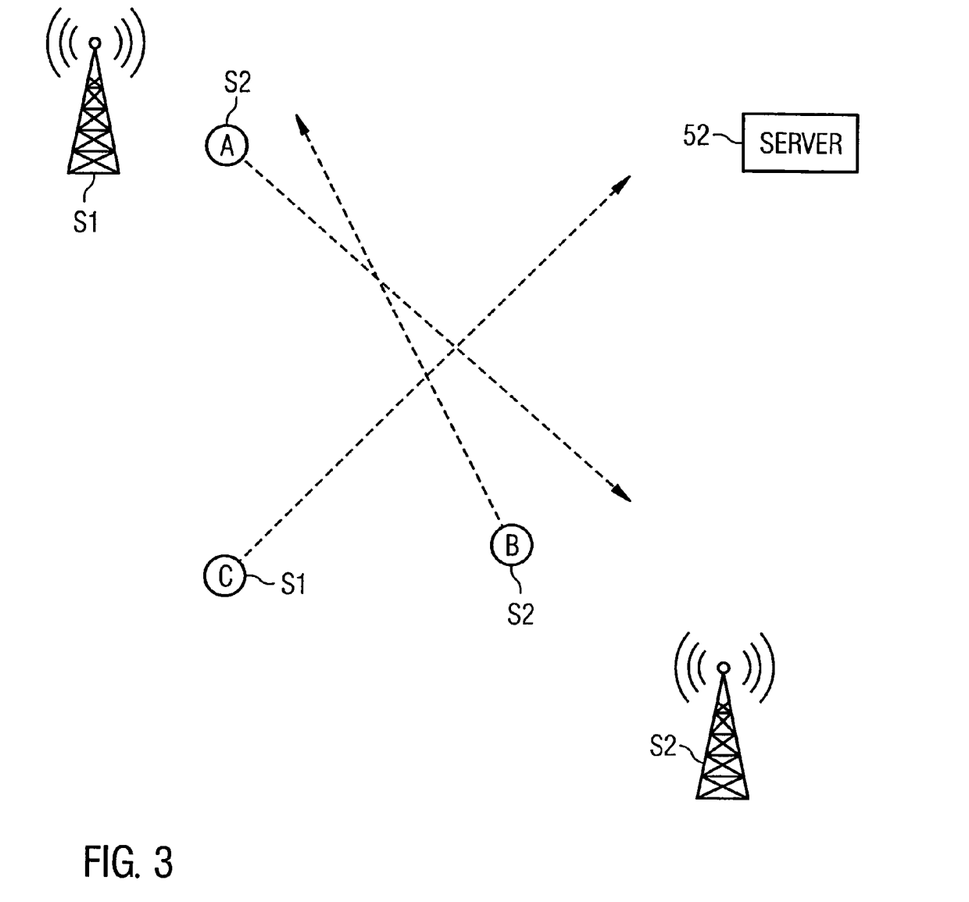
FIG. 3 illustrates an implementation of the flow chart of FIG. 2 at a time-point T1 in accordance with one embodiment of the invention.

FIG. 3 shows an implementation of the flow chart of FIG. 2 at a time point T1. The implementation relates to three cars A, B, and C and to a remotely located server 52, which is communicatively connected to the cars A, B, and C.

The cars A, B, and C are located in the same region. Users of the cars A and B are listening to a radio broadcasting station S2, while a user of the car C is listening to a radio broadcasting station S1.

At the time point T1, the step 30 of algorithm settings of FIG. 2 is done already for these cars A, B, and C. The server 52 and radio tuners of the cars A and B are then configured to communicate with each other, as in the step 34. The car A and the car B optimizes or improves their radio tuners using data stored in their local radio tuner databases, as shown in the step 44.

These improved tuner parameters are later stored in their respective radio tuner local databases. After this, these tuner parameters are transferred from the radio tuner local databases to a radio tuner database of the server 52, as shown in the step 46. The transferred tuner parameters and other transferred tuner information are then verified, as shown in the step 38.

Later, data in the local radio tuner databases are transferred to the server radio tuner database, as shown in the step 46.

Figure 4:
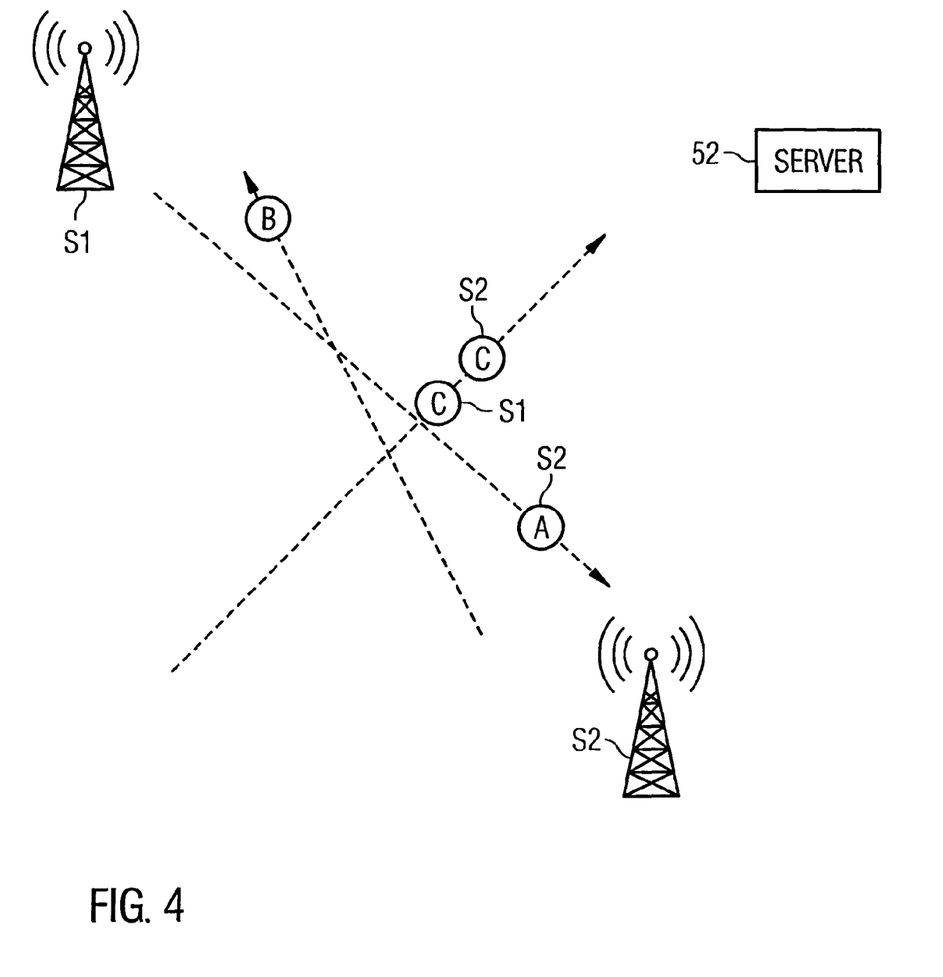
FIG. 4 illustrates the implementation of the FIG. 3 at a later time-point T2 in accordance with one embodiment of the invention.

FIG. 4 shows the implementation of FIG. 3 at a later time point T2, which occurs after the time point T1. At the time point T2, radio tuner of the car C also tunes to the station S2. The server 52 detects that the cars A, B, and C are in the in the same region. The server 52 stores the improved tuner parameters, which are developed by the radio tuners of the cars A and B.

Instead of the radio tuner of the car C performing the step 44 of improving radio tuner parameters, the server 52 provides the required improved tuner parameters to the radio tuner of the car C by sending the stored improved tuner parameters to the radio tuner of the car C. The radio tuner of the car C later uses these transmitted improved tuner parameters.

In summary, the embodiment provides a server that is connected communicatively to multiple vehicles via wireless means. The vehicles are located in the same region.

The server communicates with the vehicles according to GSM, Wi-Fi, or other wireless protocols. The server obtains sensor information, location information, tuner reception or performance information, and other condition information from the vehicles.

The server then processes the received vehicle information to determine tuner parameter information for tuners of the different vehicles in a manner that is outlined in the application Patent PCT/IB2010/054929.

In conjunction with this processing by the server, onboard tuner boards of the vehicles may also process the vehicle information to determine the tuner parameter information. Once the tuner parameter information is generated, this generated information is also communicated and is shared with the server.

The server then stores and arranges the tuner parameter information in a database such that radio tuners of vehicles can access the information. The tuner parameter information may be generated by the server or by the tuners of the vehicles. The tuner parameters may relate to one region or to several regions. The database serves as a central system for tuner parameters that improves over time. The information has expiration dates such that the user access current appropriate information.

It should be noted that the server, which usually has a much larger storage space than the vehicle radio tuners, provides a means for storing information received from the car.

In a case of a vehicle reaching a different region as detected by a navigation guidance device of the vehicle, the radio tuner may obtain new tuner parameters that are appropriate for the region from the server. The radio tuner may prompt a user of the vehicle to accept these new tuner parameters. If the user accepts these new tuner parameters, the radio tuner afterward operates according to the new tuner parameters. Alternatively, the radio tuner may automatically operate according to the new tuner parameters when the vehicle reaches the different region.

The radio tuner does not need to generate tuner parameters that are appropriate for its location since a group or community of vehicle radio tuners can share the same tuner parameters via the server.

Figure 5:
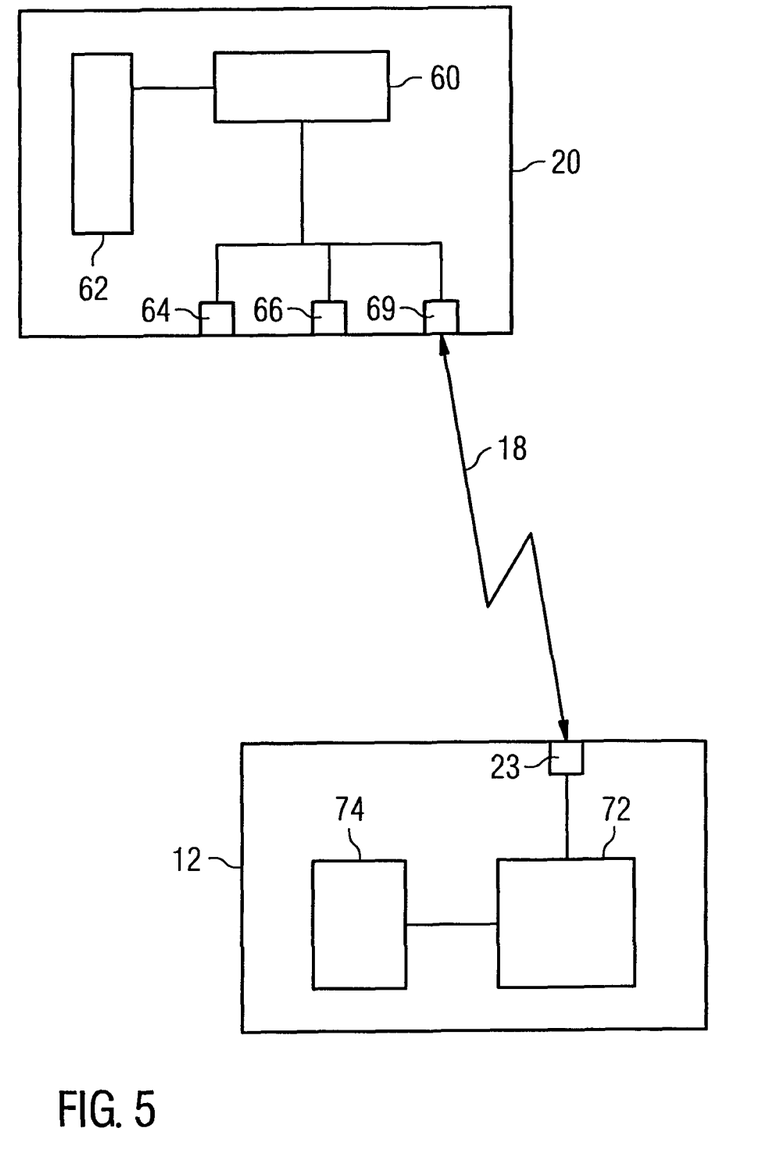
FIG. 5 illustrates an implementation of the radio tuner system of FIG. 1 in accordance with one embodiment of the invention.

FIG. 5 shows an implementation of the radio tuner system of FIG. 1. The implementation includes a radio tuner 20 being communicatively connected to a server 12 via a wireless link medium 18.

Referring to the radio tuner 20, it includes a tuner-processing unit 60 being electrically connected to a tuner front-end unit 62 and to several communication ports, wherein these ports comprise a location data communication port 64, a sensor communication port 66, and a server communication port 69. In contrast, the server 12 includes a server-processing unit 72 being electrically connected to a data storage unit 74 and to a receiver communication port 23.

In use, the location data communication port 64 receives location information of the tuner 20 from a Global Positional Satellite (GPS) device.

The sensor communication port 66 receives information regarding a vehicle that is installed with the tuner 20. The information originates from sensors that are mounted inside as well as outside the vehicle. The sensor information relates to geographical information of the vehicle or of the tuner 20. An example of the geographical information is altitude data. The sensor information also includes tuner performance information, such as tuner signal to noise ratio.

The tuner-processing unit 60 is intended for receiving information from the location data communication port 64 and the sensor communication port 66. The tuner-processing unit 60 also sends the received information to the server 12 via the server port 69 to request for tuner parameters, which correspond to the received information.

The receiver communication port 23 is used for receiving information from the tuner 20 via the server port 69 of the tuner 20 and for sending the received information to the server-processing unit 72.

The server-processing unit 72 retrieves tuner parameters from the data storage unit 74 according to the received information. When the data storage unit 74 does not have the required tuner parameters corresponding to the received information, the server-processing unit 72 generates these required tuner parameters according to the received information and then stores these required tuner parameters in the data storage unit 74. In addition, the server-processing unit 72 sends the required tuner parameters to the requesting tuner 20.

The data storage unit 74 is provided for storing tuner parameters with their associated information. These tuner parameters and/or their associated information may originate from other tuners. In other words, the data storage unit 74 can serve as a collection area for tuner parameters from a group of tuners and for sharing the appropriate tuner parameters with the requesting tuners.

The tuner-processing unit 60 also receives the tuner parameters from the server 12 and sends these tuner parameters to the tuner front-end unit 62, which then operates according to the received tuner parameters. Since these tuner parameters are generated according to current location information and to current sensor information, these tuner parameters allow the tuner front-end unit 62 to operate appropriately in the present environment. This is especially important when the tuner 20 has moved to a different region or when tuner 20 is in a different environment. The different new environment may have hills that require a different set of tuner parameters to compensate for sonic effects caused by the hills.

Although the above description contains much specificity, this should not be construed as limiting the scope of the embodiments but merely providing illustration of the foreseeable embodiments. The above stated advantages of the embodiments should not be construed as limiting the scope of the embodiments but merely to explain possible achievements if the described embodiments are put into practice. Thus, the scope of the embodiments should be determined by the claims and their equivalents, rather than by the examples given.

The invention claimed is:

1. A mobile radio receiver for a vehicle comprising a tuner front-end section,
    a location data port configured to receive tuner location data;
    a sensor port configured to receive sensor signal measurement data from at least one vehicle sensor;
    a tuner front-end section parameter server port configured to send to a server the tuner location data and the sensor signal measurement data and configured to receive from the server a set of tuner front-end section parameter data; and
    a data processing unit being operably connected to the tuner front-end section, the location data port, the sensor port, and the tuner front-end section parameter server port,
    wherein the mobile radio receiver provides an operational mode, a checking mode, a tuner parameter retrieval mode, and a tuner parameter application mode,
    wherein in the operational mode, the tuner front-end section operates according to one set of tuner front-end section parameters,
    wherein in the checking mode, the data processing unit checks the sensor signal measurement data against at least one pre-determined threshold data such that the mobile radio receiver enters the parameter retrieval mode when a corresponding part of the sensor signal measurement data exceeds the at least one pre-determined threshold data,
    wherein in the parameter retrieval mode, the tuner front-end section parameter server port sends the tuner location data and the sensor signal measurement data and receives a new set of tuner front-end section parameter data from the server, the new set of tuner front-end parameter data being based at least in part on parameter data from mobile radio receivers of other vehicles, and
    wherein in the parameter application mode, the data processing unit updates the tuner front-end section with the new set of tuner front-end section parameter data.

2. The mobile radio receiver according to claim 1, wherein the data processing unit further comprising a local storage device configured to store the set of tuner front-end section parameters, tuner location data, and sensor signal measurement data received from at least one vehicle sensor, wherein the mobile radio receiver further provides a parameter storage mode, and wherein in the parameter storage mode, the local storage device stores the set of tuner front-end section parameters, tuner location data, and sensor signal measurement data received from at least one vehicle sensor.

3. The mobile radio receiver according to claim 2, wherein the local storage device further stores at least two pre-determined relationship data set for determining a set of tuner front-end section parameters corresponding to sensor signal measurement data received from at least one vehicle sensor, the mobile radio receiver further provides a tuner parameter adjustment mode, wherein in the parameter adjustment mode, the data processing unit determines a new set of tuner front-end section parameters according to the relationship data set, the tuner location data, and the sensor signal measurement data.

4. The mobile radio receiver according to claim 3, further providing a tuner front-end section parameter server update mode, wherein in the tuner front-end section parameter server update mode, the tuner front-end section parameter server port sends the new set of tuner front-end section parameters, tuner location data, and sensor signal measurement data received from at least one vehicle sensor.

5. A tuner front-end parameter section parameter server for a mobile radio receiver of a vehicle, comprising:
    a mobile radio receiver port configured to receive tuner location data and at least one sensor signal measurement datum and configured to send a set of tuner front-end section parameters;
    a server storage device configured to store at least two tuner location data, at least two sensor signal measurement data, and at least two sets of tuner front-end section parameters; and
    a data processing unit being operably connected to the mobile radio receiver port and the server storage device,
    wherein the tuner front-end section parameter server provides a tuner parameter provision mode,
    wherein in the tuner parameter provision mode,
        the mobile radio receiver port receives the tuner location data and the at least one sensor signal measurement datum,
        the data processing unit retrieves tuner front-end section parameters according to the tuner location data and the at least one sensor signal measurement datum from the server storage device, and
        the mobile radio receiver port sends the set of tuner front-end section parameters to a tuner front-end section of at least one vehicle for the vehicle to update the tuner front-end section based on the tuner front-end section parameters received from the mobile radio receiver port of the server, the set of tuner front-end parameter data being based at least in part on parameter data from mobile radio receivers of other vehicles.

6. The tuner front-end section parameter server according to claim 5, wherein the server storage device further stores at least two pre-determined relationship data sets, the tuner front-end section parameter server further provides a tuner parameter adjustment mode, wherein in the tuner parameter adjustment mode, the mobile radio receiver port receives the tuner location data and the at east one sensor signal measurement datum, and the data processing unit determines a new set of tuner front-end section parameters according to the tuner location data, the sensor signal measurement datum, and the relationship data set.

7. The tuner front-end section parameter server according to claim 5, wherein the tuner front-end section parameter server further provides a parameter receipt mode, and wherein in the parameter receipt mode, the mobile radio receiver port receives a new set of tuner front-end section parameters, tuner location data, and at least one sensor signal measurement datum.

8. The tuner front-end section parameter server according to claim 6, wherein the tuner front-end section parameter server further provides a parameter storage mode, and wherein in the parameter storage mode, the server storage device stores the new set of tuner front-end section parameters, the tuner location data, and the at least one sensor signal measurement datum in the server storage device.

9. A method for operating a mobile radio receiver of a vehicle, the method comprising:

operating a tuner front-end section according to at least one predetermined tuner front-end section parameter;

checking at least one sensor signal measurement datum against at least one predetermined threshold and causing the mobile radio receiver to perform the parameter retrieval when the at least one sensor signal measurement datum exceeds the at least one predetermined threshold;

sending tuner location data and the at least one sensor signal measurement datum to a tuner front-end section parameter server;

receiving a new set of tuner front-end section parameters from the tuner front-end section parameter server; and updating the tuner front-end section with the new set of tuner front-end section parameters from the server, the new set of tuner front-end parameter data being based at least in part on parameter data from mobile radio receivers of other vehicles.

10. The method according to the claim 9, further comprising determining a new set of tuner front-end section parameters according to the tuner location data, the at least one sensor signal measurement datum, and a relationship data set.

11. The method according to the claim 10, further comprising sending the new set of tuner front-end section parameters, the tuner location data, and the at least one sensor signal measurement datum to the tuner front-end section parameter server.

12. The method according to the claim 9, further comprising storing the new set of tuner front-end section parameters, the tuner location data, and the at least one sensor signal measurement datum.

13. A method for operating a tuner front-end section parameter server for a mobile radio receiver of a vehicle, the method comprising:

receiving a tuner location data and at least one sensor signal measurement datum from the mobile radio receiver;

retrieving one specific set of tuner front-end section parameters out of a set of pre-determined tuner front-end section parameters according to the tuner location data and the at least one sensor signal measurement datum; and sending the set of tuner front-end section parameters to the mobile radio receiver to a tuner front-end section of at least one vehicle for the vehicle to update the tuner front-end section based on the tuner front-end section parameters received from the mobile radio receiver port of the server, the set of tuner front-end parameter data being based at least in part on parameter data from mobile radio receivers of other vehicles.

14. The method according to claim 13, further comprising:

determining a new set of tuner front-end section parameters according to the tuner location data, the at least one sensor signal, and a relationship data set; and storing the new set of tuner front-end section parameters, the tuner location data, and the at least one sensor signal.

15. The method according to claim 13, further comprising:

receiving a new set of tuner front-end section parameters, tuner location data, and at least one sensor signal from the mobile radio receiver; and storing the new set of tuner front-end section parameters, the tuner location data, and the at least one sensor signal.

* * * * *